(12) United States Patent
Coutts et al.

(10) Patent No.: US 9,496,851 B2
(45) Date of Patent: Nov. 15, 2016

(54) SYSTEMS AND METHODS FOR SETTING LOGIC TO A DESIRED LEAKAGE STATE

(71) Applicant: QUALCOMM Incorporated, San Diego, CA (US)

(72) Inventors: Ryan Michael Coutts, Carlsbad, CA (US); Wai Kit Siu, San Diego, CA (US); Paul Ivan Penzes, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/482,403

(22) Filed: Sep. 10, 2014

(65) Prior Publication Data

US 2016/0072480 A1 Mar. 10, 2016

(51) Int. Cl.
*H03K 3/012* (2006.01)
*H03K 3/037* (2006.01)
*H03K 17/22* (2006.01)
*H03K 19/00* (2006.01)
*G05B 19/045* (2006.01)

(52) U.S. Cl.
CPC ............ *H03K 3/012* (2013.01); *G05B 19/045* (2013.01); *H03K 3/0372* (2013.01); *H03K 17/223* (2013.01); *H03K 19/0008* (2013.01)

(58) Field of Classification Search
CPC .. H03K 3/012; H03K 3/0372; H03K 17/223; G05B 19/045
USPC .......................................................... 326/46
See application file for complete search history.

(56) References Cited

U.S. PATENT DOCUMENTS

| | | | | |
|---|---|---|---|---|
| 6,946,869 B2 * | 9/2005 | Jacobson | ........... | H03K 19/0016 326/33 |
| 7,109,749 B2 * | 9/2006 | Khanna | ............ | H03K 19/17784 326/37 |
| 7,372,290 B2 * | 5/2008 | Fruhauf | ................ | G06F 21/558 326/46 |
| 7,808,273 B2 | 10/2010 | Flynn | | |
| 2004/0236971 A1 | 11/2004 | Kopley et al. | | |
| 2009/0051388 A1 * | 2/2009 | Flynn | .................. | H03K 19/0008 326/46 |
| 2010/0085072 A1 * | 4/2010 | Wu | ..................... | G01R 31/3008 324/762.01 |

(Continued)

FOREIGN PATENT DOCUMENTS

EP 2339752 A1 6/2011

OTHER PUBLICATIONS

International Search Report and Written Opinion—PCT/US2015/041394—ISA/EPO—Oct. 26, 2015.
Second Written Opinion from International Application No. PCT/US2015/041394, mailed Aug. 24, 2016, 9 pages.

*Primary Examiner* — Dylan White
(74) *Attorney, Agent, or Firm* — Haynes and Boone, LLP

(57) ABSTRACT

Circuits and methods for reducing leakage are provided. In one example, a system includes circuitry to reset a particular logic circuit to a state of reduced leakage. The state of reduced leakage would be known beforehand for the logic circuit. In this example, the logic circuit includes the combinational logic as well as flip flops that output a state to the combinational logic. Some of the flip flops are "SET" flip flops (assuming a 1 output value when a reset input is asserted) and some of the flip flops are "RESET" flip flops (assuming a 0 value when a reset input is asserted). The flip flops are chosen as inputs to the combinational logic so that the particular combination of zeros and ones output to the combinational logic puts the logic circuit in a state that is correlated with a desired level of leakage.

26 Claims, 5 Drawing Sheets

(56) References Cited

U.S. PATENT DOCUMENTS

| | | | |
|---|---|---|---|
| 2011/0148496 A1* | 6/2011 | Sriadibhatla | H03K 19/0008 327/202 |
| 2013/0009697 A1 | 1/2013 | Bailey et al. | |
| 2013/0069692 A1* | 3/2013 | Cressman | G06F 1/3237 326/54 |
| 2013/0241593 A1* | 9/2013 | Sethuram | G01R 31/31834 326/16 |

* cited by examiner

SYSTEMS AND METHODS FOR SETTING LOGIC TO A DESIRED LEAKAGE STATE

TECHNICAL FIELD

This application relates to low-power methodologies, and more particularly, to setting circuits to low leakage states.

BACKGROUND

A logic gate (e.g., a NAND gate) is made of multiple transistors, and a Central Processing Unit (CPU) or Graphics Processing Unit (GPU) includes many logic gates to provide processing capability. For instance, a particular pipeline stage in a CPU may include combinational logic having multiple, cascaded logic gates that feed information to a next pipeline stage. Thus, each pipeline stage may include a very large number of transistors.

A conventional transistor is subject to a phenomenon called "leakage," where current is consumed even though the transistor is not transitioning between states. Leakage is a result of a given transistor being disposed between two different voltages where the transistor has a finite amount of resistance—some amount of current inevitably flows. Thus, even when a transistor is held in an OFF state, it still conducts some amount of current. In aggregate over the millions of transistors in a CPU or GPU, leakage current can consume a significant portion of the overall device power.

For a given logic gate, the amount of leakage current attributable to that logic gate depends on the state of the gate at a particular time. Therefore, as time goes on and the clock goes through many cycles, the logic gate transitions through states, with some states responsible for more leakage than others. The same is true for combinational logic made of multiple logic gates. As the clock goes through many cycles, the combinational logic changes states too (where the state of the combinational logic is attributable to the individual states of the logic gates).

Some conventional systems employ clock gating, wherein combinational logic is idled by holding the clock signal to a one or a zero for a period of time. When a clock to a particular piece of combinational logic is gated in such a conventional system, the combinational logic preserves its state until the clock is un-gated. However, the combinational logic may be in a state that includes a high level of leakage when the clock is gated, thereby resulting in wasted power when the combinational logic is idled.

There is a need to reduce leakage current, whether in a clock gating scenario or otherwise.

SUMMARY

Circuits for setting logic in a desired leakage state are provided. In one example, the system includes circuitry to reset a particular logic circuit to a state of reduced leakage. The state of reduced leakage would be known beforehand for the logic circuit. In this example, the logic circuit includes the combinational logic as well as sequential logic (e.g., flip flops) that output a state to the combinational logic. In an example using flip flops, some of the flip flops are "SET" flip flops (assuming a 1 output value when a reset input is asserted) and some of the flip flops are "RESET" flip flops (assuming a 0 value when a reset input is asserted). The flip flops are chosen as inputs to the combinational logic so that the particular combination of zeros and ones output to the combinational logic puts the logic circuit in a state that is correlated with a desired level of leakage.

In one embodiment, operation of the circuit includes resetting the flip flops to their forced states, such that the flip flops collectively output a multi-bit binary number including ones and zeros to the combinational logic. The combinational logic receives the multi-bit number just as it would a data input and assumes a state in response thereto. In this example, the multi-bit number corresponds to a low leakage state of the circuit having the flip flops and the combinational logic.

In another embodiment, operation of the reset signal is performed by a clock gating circuit. Thus, when the clock gating circuit suspends the clock to the flip flops, it also asserts the reset signal, thereby resetting the flip flops to their forced states. As the flip flops hold their forced states, and as the combinational logic holds a state caused by the states of the flip flops, the circuit remains in a low leakage state for the duration of the clock gating operation.

Various embodiments provide one or more advantages over conventional solutions. For instance, in some embodiments the circuit having the combinational logic and the flip flops starts up in a low leakage state, thereby conserving energy. In embodiments that control the low leakage state using a clock gating circuit, clock gating operations result in greater energy savings because of the low leakage state. These and other advantages may be better appreciated by the detailed description below.

DETAILED DESCRIPTION

Example Circuit Embodiments

Various embodiments are directed to circuit designs that reduce leakage in various applications. For instance, some embodiments find application in a microprocessor, such as a CPU, GPU, Digital Signal Processor (DSP), Application Specific Integrated Circuit (ASIC) and/or the like. Such systems typically include pipeline stages having sequential logic, such as flip flops, outputting values to combinational logic, where the combinational logic may include a combination of cascaded logic gates. The sequential logic is used as a delay, where incoming bits of data may be received by the individual sequential circuits at different times. The group of sequential circuits then output the data bits at the same time according to a clock edge, thereby assuring that the data is input to the combinational logic in a synchronized manner.

Continuing with the example using D flip flops as the sequential logic, the individual flip flops are selected as either SET or RESET flip flops to output a heterogeneous value that is a combination of ones and zeros. In one aspect, each flip flop has only one possible forced state, which is in contrast to other sequential logic that may have two or more possible forced states (e.g., a SET/RESET flip flop). The combination of ones and zeros is output from the sequential logic to the combinational logic, and the entire stage then assumes a known state that corresponds to a desired leakage characteristic.

Figure 1:
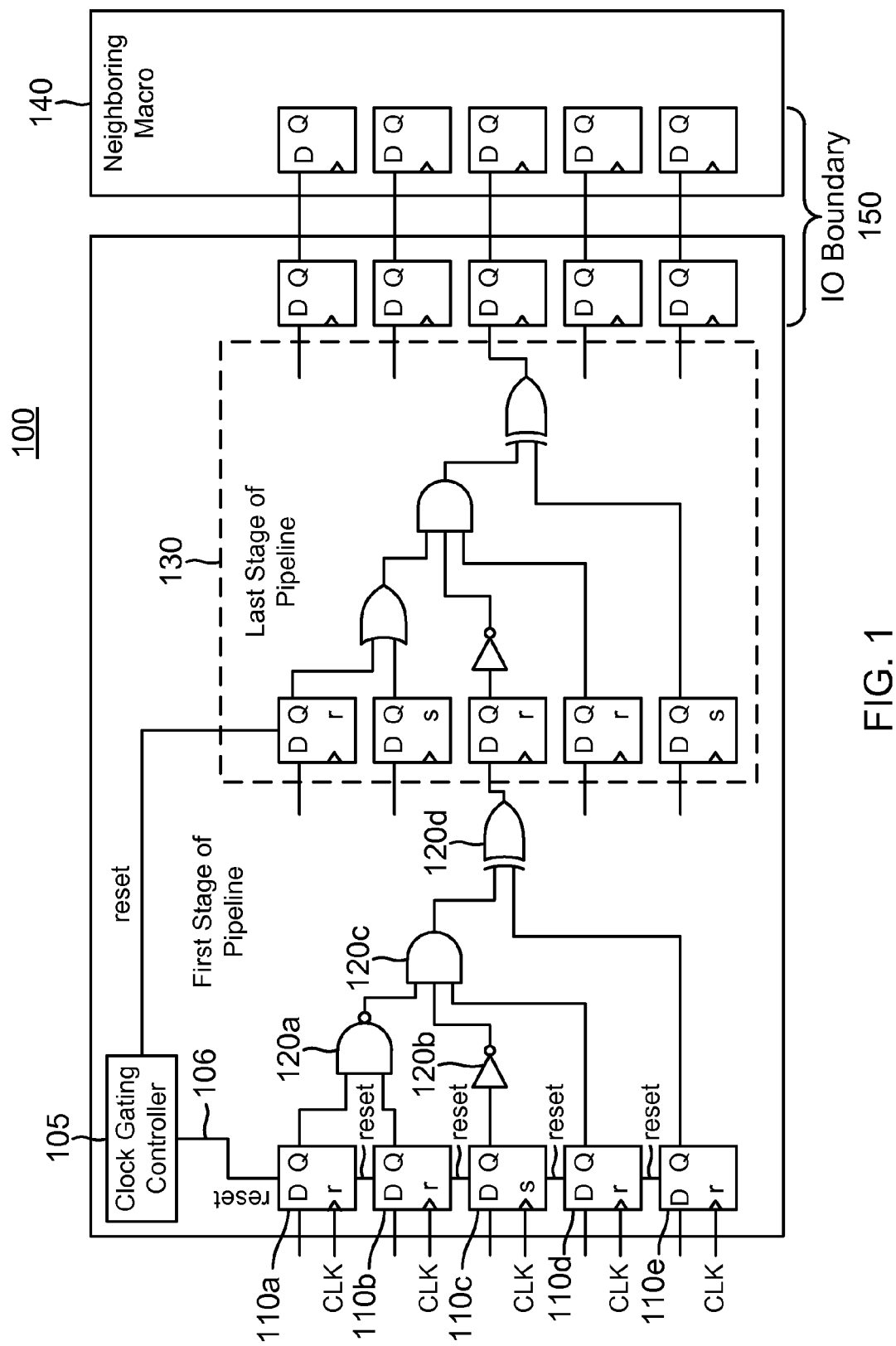
FIG. 1 illustrates an example processor portion implementing a technique to achieve a desired leakage state in accordance with an embodiment of the disclosure.

Turning now to the drawings, FIG. 1 illustrates example processor portion 100 adapted according to one embodiment.

Processor portion 100 includes a first pipeline stage that has sequential logic (flip flops 110a-e) and combinational logic (logic gates 120a-d). The present example describes one embodiment to reduce leakage power at the first pipeline stage. It is understood, though, that the various principles described in this example apply just as well to second pipeline stage 130, though an in-depth discussion of second pipeline stage 130 is omitted for ease of illustration.

Processor portion 100 further includes neighboring macro 140, which may indicate another processor core, memory unit, or other type of component on the other side of Input/Output (IO) boundary 150 from the first and second pipeline stages. IO boundary 150 is discussed in more detail further below. The elements of FIG. 1 (including both pipeline stages and neighboring macro 140) may be included on a single semiconductor die in some embodiments.

Focusing on the first pipeline stage, sequential logic 110 outputs logic values to combinational logic 120. In this example, each of the sequential logic circuits 110a-e is a D flip flop that has a clock input (CLK), a data input, (labeled "D"), a data output (labeled "Q"), and a reset input (labeled "reset"). Using flip flop 110 as an example, a data value is received at D and is clocked in at a clock edge. The data is stored momentarily and is clocked out at another clock edge at output Q. The logic value output from flip flop 110a is received as an input by NAND gate 120a. The other flip flops 110b-e operate in a similar manner to provide logic values to combinational logic 120. For instance, NAND gate 120a also receives data from flip flop 110b as another of its inputs. Flip flop 110c outputs a value to NOT gate 120b; flip flop 110d outputs a value to AND gate 120c; flip flop 110e outputs a value to XOR gate 120d.

During normal operation, the values output from sequential logic 110 are data values, and the data values are input to combinational logic 120. Thus, at each clock cycle, new data is received, and new data is output to combinational logic 120.

The state of the first pipeline stage is defined by the states of the individual sequential logic circuits 110a-e and combinational logic gates 120a-d, and the number of different possible states of the first pipeline stage is equal to the number of possible combinations of states of individual components 110a-e and 120a-d. Therefore, as the clock goes through cycles, the state of the first pipeline stage changes at each cycle as a function of the received data.

Figure 2:
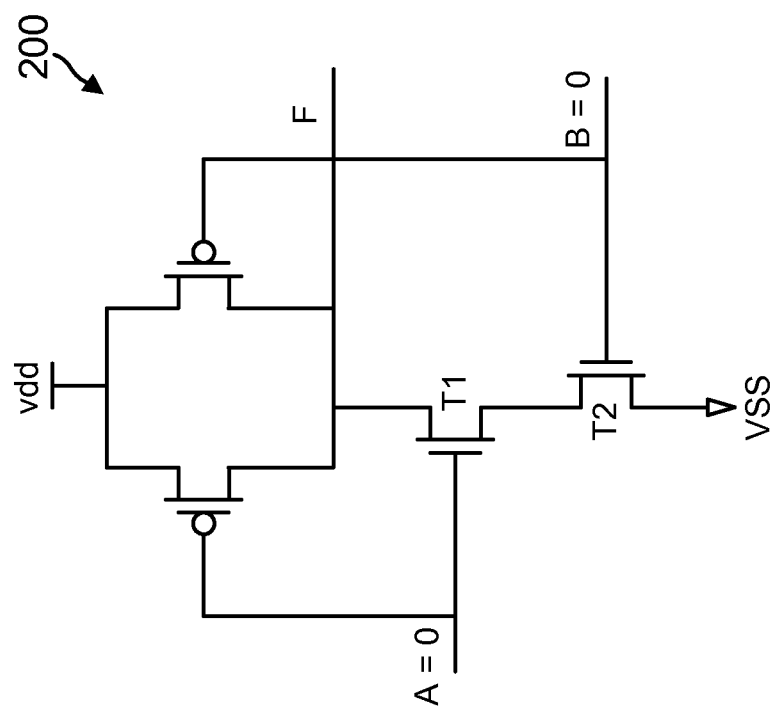
FIG. 2 illustrates an example logic gate of the processor portion in accordance with an embodiment of the disclosure.
Figure 2:
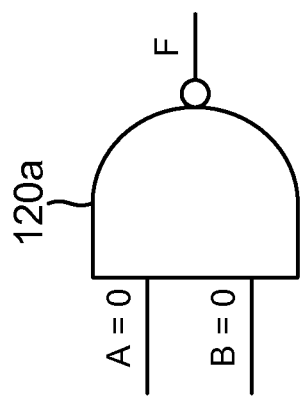

Each individual component 110a-e, 120a-d has its own leakage properties, and leakage power consumed by a logic gate depends on the input pattern applied to it. For instance, each individual component 110a-e, 120a-d has multiple possible states, where some states have more leakage than others. Take for example NAND gate 120a. FIG. 2, shows 2-input NAND gate 120a and a schematic diagram 200 of the transistors within the 2-input NAND gate 120a. Current flows from Vdd to Vss in the diagram 200. When a '00' input is applied to gate 120a, lesser leakage power is consumed compared to the other input combinations. This is because both transistors T1 and T2 are OFF when '00' is applied. When transistors T1 and T2 are OFF, there is a higher drain-to-source resistance on each of transistors T1 and T2, which results in a lesser leakage current and a lesser leakage power as compared to another state in which only one of transistors T1 and T2 is OFF (e.g., when A=1 and B=0).

Thus, FIG. 2 illustrates that leakage for a given circuit depends upon the particular placement and properties of transistors within that circuit. And while FIG. 2 applies to NAND gate 120a, it is understood that the other combinational logic gates 120b-d each include some arrangement of transistors that is subject to a higher amount of leakage in some states than in others. Furthermore, the leakage in the first pipeline stage is a sum of the leakage of the individual circuits 110a-e and 120a-d, and some states of the pipeline stage as a whole will have higher leakage than other states due to the states of the individual circuits 110a-e and 120a-d.

There exists, for the first pipeline stage, one or more states that may be referred to as a low leakage state. In some examples, the low leakage state may include the state of the first pipeline stage as a whole that has the lowest leakage state out of the various possible states. In other examples, the low leakage state may include any of a set of states of the pipeline stage as a whole that are less than a maximum leakage state. In yet other examples, the low leakage state may be selected from only those states that can be achieved by forcing states at the flip flops 110, where it is understood that there may be no combination of inputs at the flip flops 110 that can simultaneously achieve a lowest leakage individual state for all of the components 110a-e and 120a-d.

Returning to FIG. 1, processor portion 100 also includes a clock gating controller 105. Clock gating controller 105 includes logic to halt the clock signal to flip flops 110. For instance, in some embodiments, clock gating controller 105 may be in communication with another logic gate (not shown), such as a multiplexer, that blocks the clock in favor of a one or a zero value that is held until the clock gating operation ends. The scope of embodiments is not limited to any particular technique for clock gating, and any method to halt the clock to flip flops 110 may be used in various embodiments.

Of course, when the clock is halted to the flip flops 110 the first pipeline stage (including flip flops 110 and combinational logic 120) remains in its current state (with various values stored in flip flops 110) unless something else forces the state to change. Thus, if the first pipeline stage were to have its clock halted while it is in a state of relatively high leakage (due to a particular combination of values stored in flip flops 110), the first pipeline stage would retain that high leakage state while the clock is halted unless it was forced into another state.

In the present embodiment, clock gating controller 105 includes functionality to force the first pipeline stage to assume a state that is associated with a desired leakage level. Specifically, clock gating controller includes reset output 106, which is in communication with each of the flip flops 110a-e. Clock gating controller 105 asserts the reset signal, which is received at a reset input of each flip flop 110a-d and places the individual flip flops 110a-e into a respective forced state. FIG. 1 shows reset output 106 being passed from flip flop 110a to 110b to 110c (and on) for convenience of illustration; however, other implementations may include each flip flop 110a-e receiving reset signal 106 from clock gating controller 106 and not through another flip flop. The scope of embodiments is not limited to any particular technique to deliver the reset signal to the flip flops. In fact, other embodiments may assert the reset signal in any appropriate manner, including not under the control of a clock gating component.

Each of the individual flips flops 110a-e of the embodiment of FIG. 1 has a single forced state. Specifically, flip flop 110a is a RESET flip flop, and its output (Q) can be forced to a zero value by asserting the reset signal; flip flops 110b, 110d, and 110e are also RESET flip flops. Flip flop 110c is a SET flip flop, and its output is forced to a one value by asserting the reset signal. This is in contrast to, e.g., a SET/RESET flip flop, in which both a zero and a one can be selectively forced (but not at the same time).

Flip flops 110 are an example of a heterogeneous mix of SET and RESET flip flops. The flip flops 110, collectively, output a multi-bit binary value "00100" when the reset signal 106 is asserted. The first bit of the value 00100 comes from flip flop 110a, the second bit comes from flip flop 110b, the third bit comes from 110c, the fourth bit comes from 110d, and the fifth bit comes from 110d. It should be noted that the bits are heterogeneous, so that a given bit and another given bit may be different. The combinational logic gates 120 then assume states in response to the multi-bit binary value. Thus, NAND gate 120a receives "00" and outputs a 1 value. NOT gate 120b receives a 1 value and outputs a 0 value. Three-input AND gate 120c receives "100" as an input and outputs a 0 value. XOR gate 120d receives "00" as an input and outputs a 0 value. The first pipeline stage assumes this state as a whole, which is defined by the states of the individual circuits 110a-e and 120a-d, and holds the state for as long as the reset signal remains asserted.

In the present example, the state assumed by the first pipeline stage in response to the multi-bit binary value 00100 corresponds to a desired low leakage state of the first pipeline stage as a whole. Thus, while one or more individual ones of the circuits 110a-e and 120a-d may or may not be in its lowest possible leakage state, the leakage as a whole for the pipeline stage is within a lowest leakage state for the stage itself achievable by forcing a state with heterogeneous binary values. For instance, AND gate 120c is in a low leakage state but not its lowest possible leakage state (not its highest leakage state, either). NOT gate 120b is an inverter in this example, and low leakage states for inverters generally depend upon manufacturing processes thereof. So while NOT gate 120b is shown receiving a 1 value, it is understood that NOT gates in other embodiments might experience lower leakage receiving a 0 value, depending on their manufacturing processes. Also, low leakage states for flip flops 110a-e depend on the particular circuit design. In the example of FIG. 2, the flip flops 110a-e are in a lowest leakage state when outputting a 0 value, through flip flops of other designs may experience lower leakage when outing a 1 value. It is noted that the desired leakage state of the first pipeline stage takes into account a leakage contribution of the sequential logic 110 as well as the combinational logic 120.

Of course, the example given above is made for illustration only, and other stages may have different low leakage states, depending on the types of sequential logic and combinational logic used, including the arrangement and types of transistors within the individual circuits of the stage. Desired leakage states for a stage may be identified using simulation tools, such as those employing VERILOG (IEEE 1364) as a hardware description language. A circuit designer may simulate one more potential stage designs to identify one or more multi-bit binary values that produce desired leakage states. For instance, some multi-bit binary values may result in more leakage than do others, and the designer can choose cells from a library to achieve an identified desired leakage value when creating the stage. The scope of embodiments is not limited to any particular technique for design simulation, nor to any particular technique for achieving combinational behavior for data.

As noted above, the last pipeline stage 130 may be designed in a similar manner so that both pipeline stages may be forced to low leakage states when appropriate. The embodiment of FIG. 1 shows two pipeline stages, however, the scope of embodiments may be applied to processor portions with any number of pipeline stages. Also, the particular combinational logic of FIG. 1 is an example. In fact, the principles described above with respect to FIG. 1 may be applied to any circuit that includes sequential logic outputting multi-bit values to combinational logic.

Furthermore in this example, neighboring macro 140 and IO boundary 150 are not included in the leakage reduction technique described above. For instance, neighboring macro 140 may expect a particular input value at startup (e.g., all zeroes or all ones). Thus, the sequential logic 160 at the IO boundary 150 may be selected instead to provide an expected value rather than a value associated with a desired leakage state. For example, flip flops 160a-e, which output values to neighboring 140, each have a forced state of zero or one. The forced states of flip flops 160a-e provide a value that is expected by neighboring macro 140 regardless of whether the output is a low/lowest leakage state. Various embodiments may be applied to any appropriate processing logic and may be applied stage-by-stage, all while preserving desired startup values at IO boundaries or other sensitive portions.

The embodiments described above may include one or more advantages over conventional systems. For instance, the desired low leakage state of the first pipeline stage may be used as the start-up state when processor portion 100 is powered-up. In such embodiment, the first pipeline stage would then remain in a low leakage state until data is clocked in, thereby reducing power use at startup.

Furthermore, the embodiment illustrated in FIG. 1 changes states of the sequential logic circuits (flip flops 110) themselves to provide the desired multi-bit binary number as explained below with respect to FIG. 3. This is in contrast to a system that uses one or more extra logic gates between the sequential logic and the combinational logic to provide the desired multi-bit binary number. The embodiment illustrated in FIG. 1 is less complex, by omitting the extra logic gates, and also can be relied upon at startup to assume the correct state without having to have additional logic to set that desired state at the extra logic gates.

Figure 3:
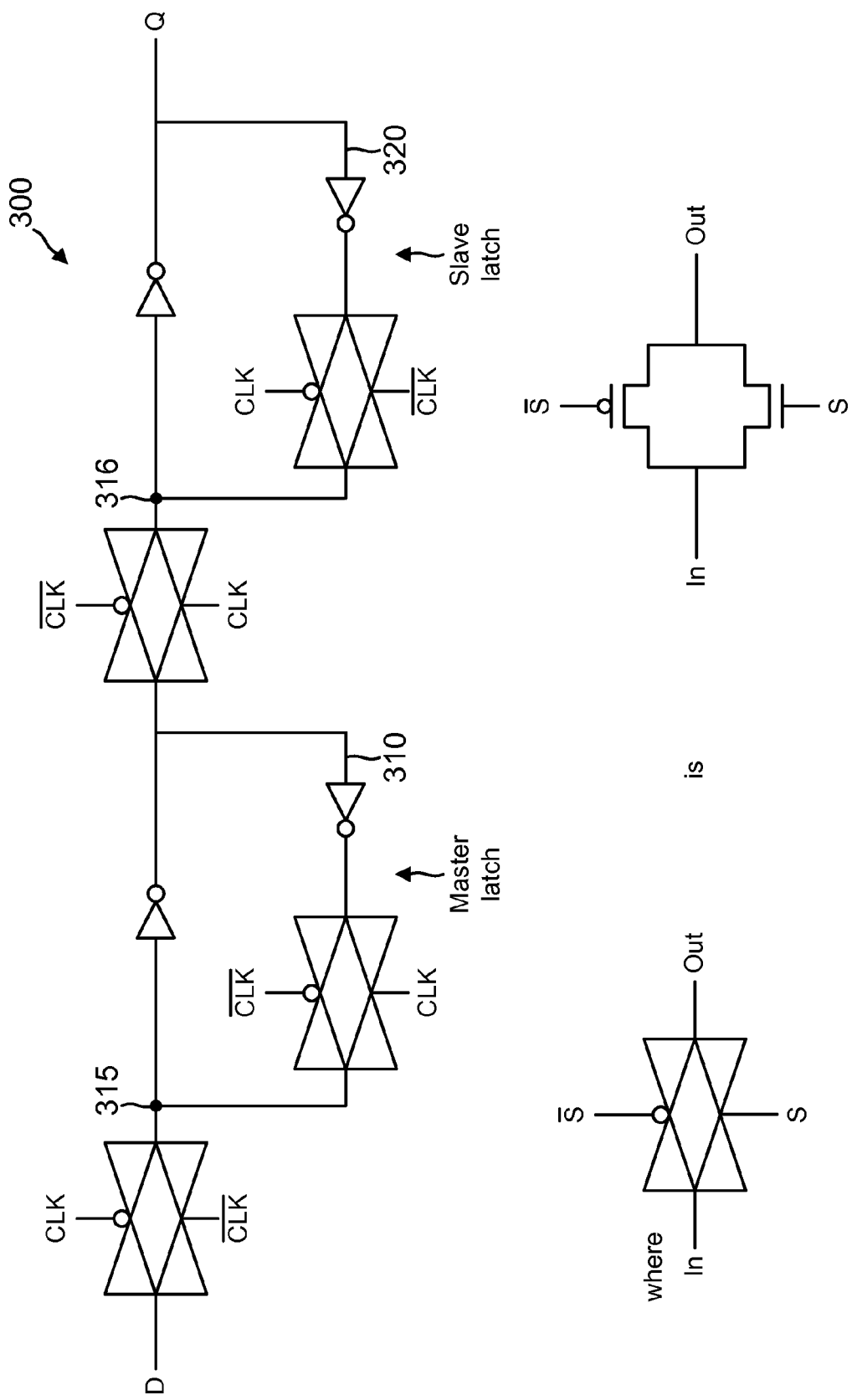
FIG. 3 illustrates an example flip flop of the processing portion in accordance with an embodiment of the disclosure.

FIG. 3 is an illustration of example flip flop 300, according to one embodiment. FIG. 3 includes a schematic diagram of an implementation of any of flip flops 110, and it is understood that flip flops in other embodiments may include different features or may have different internal logic. It is also understood that the set or reset circuitry of flip-flops 110 is not illustrated in FIG. 3.

FIG. 3 shows an example implementation of flip flop 110a with data input "D" and data output "Q." Flip flop 110a has two latches—master latch 310 and slave latch 320. The reset signal of FIG. 1 (or a signal derived from the reset signal) can be used to force either of nodes 315 and 316 to a desired voltage, thereby causing a reset state. Thus, in this example, the reset signal can be used to force a state of the flip flop 300. A SET flip flop, for example, receives a zero value at node 316 in response to the reset signal and holds a one value at Q. By contrast, a RESET flip flop receives a one value at node 316 in response to the reset signal and holds a zero value at Q.

Returning to FIG. 1, another advantage of some embodiments is that the single forced states of the flip flops 110 may employ less wiring than a similar design using flip flops with multiple forced states. For instance, in FIG. 1, the flip flops 110 can be forced into a state using a single signal—the reset input. By contrast, an embodiment using SET/RESET flip flops (or other sequential logic with multiple forced states) may employ two or more signals to force desired states, thereby increasing the number of wires used to carry the forcing signals.

Figure 4:
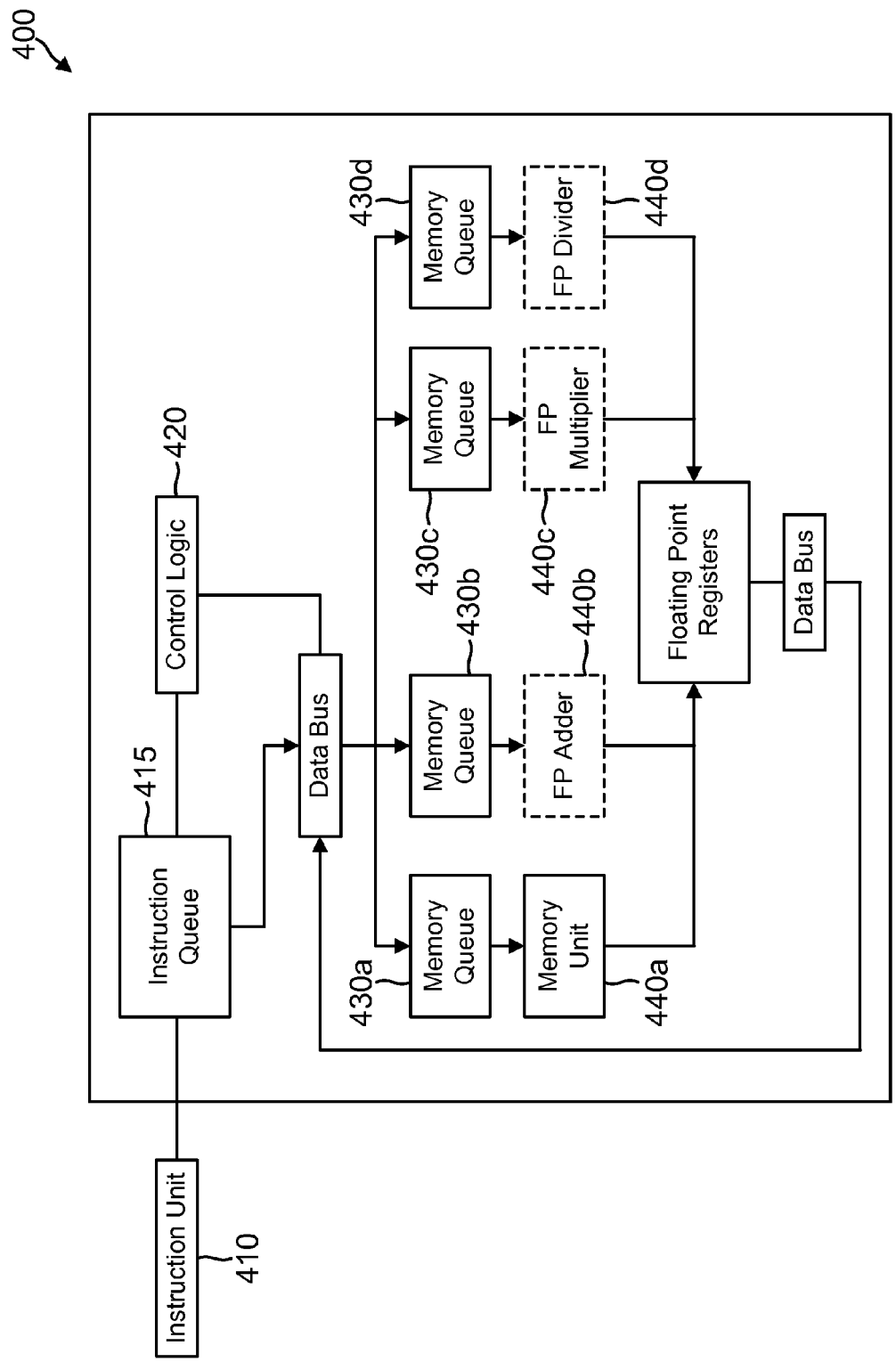
FIG. 4 illustrates an example processor portion, encompassing the processor portion of FIG. 1, according to an embodiment of the disclosure.

FIG. 4 illustrates processor portion 400 adapted according to one embodiment. Processor portion 400 includes instruction unit 410, which generates instructions from an instruction set. Instruction unit 410 places the instructions into instruction queue 415. Control logic 420 moves the instructions from queue 415 into an appropriate memory queue 430. Each memory queue 430a-d serves a respective functional unit 440a-d.

Functional unit 440a is a memory unit; functional units 440b-d are specialized floating point (FP) functional units. FP units 440b-d use relatively leaky transistors (e.g., fast transistors having lower threshold voltages than nominal speed transistors used in other functional units) and, thus, may benefit from the principles discussed above with respect to FIG. 1. In fact, each of the FP units 440b-d may be pipelined and include processor portions similar to processor portion 100 of FIG. 1. Or put another way, FP adder 440b may include one or more stages, such as the first and second pipeline stages of FIG. 1, and the principles of FIG. 1 may be applied to the pipeline stages (not shown) of FP adder 440b to place one or more pipeline stages into a desired leakage state. The same is true for FP units 440c and 440d.

When a given FP unit 440b-d has completed its current job, and there is no other job in its respective memory queue 430b-d, the FP unit can be halted by gating its clock signal. Furthermore, FP units 440b-d do not require state preservation in this example. Thus, when a given FP unit 440b-d is clock-gated, one or more of its stages can be forced into a low leakage state, as shown above in FIG. 1. Later, when an instruction appears in its respective memory queue 430b-d, the given FP unit 440b-d can be used by un-gating its clock and entering the instruction as bits through its stages.

The scope of embodiments is not limited to FP adders, multipliers, and dividers. Rather, the low leakage technique of FIG. 1 can be applied to any part of a processor that does not require preservation of its current state. Furthermore, the low leakage technique of FIG. 1 may be applied stage-by-stage, such that fewer than all stages of a given FP unit 440b-d can be forced into a desired leakage state as appropriate.

Example methods of use for the low leakage technique of FIG. 1 will now be discussed.

Example Methods of Use

A flow diagram for an example method 500 of a technique to force a processing stage into a desired leakage state is shown in FIG. 4, according to one embodiment. Method 500 may be performed by a processor portion, such as processor portion 100 of FIG. 1.

The example below is in the context of forcing a desired leakage state during a clock gating operation; however, the scope of embodiments is not so limited. For instance, the actions of blocks 530 and 540 may be performed during circuit testing, at power-up of a processor, or at other appropriate times.

The method begins at a block 510, which includes receiving data bits and a clock signal during normal operation at a processing stage having sequential logic and combinational logic.

In the example of FIG. 1, the first pipeline stage receives the CLK signal and data at the flip flops 110. The flip flops 110 then pass the data to the combinational logic 120. During normal operation, multiple clock cycles occur over a period of time, and data is received at each clock cycle.

At block 520, the pipeline stage ends normal operation as the clock is halted during a clock gating operation. For instance, in FIG. 1, clock gating controller 105 may halt the clock signal CLK to the flip flops 110. In some embodiments, the clock gating controller 105 halts the clock in response to determining that the pipeline stage has no instruction waiting in a queue to be processed. The clock gating operation in this instance is performed in order to save power.

At block 530, the sequential logic receives a reset signal. In the example of FIG. 1, one source (controller 105) originates the reset signal, and so each of the individual flip flops 110a-e receives the same reset signal. Further in the example of FIG. 1, controller 105 asserts the reset signal as the clock gating operation begins and may continue asserting the reset signal while the clock is gated. In this way, controller 105 may use existing clock gating logic to assert the reset signal just as it asserts one or more other signals (not shown) to gate the clock.

Continuing with the example, the sequential logic includes multiple sequential logic circuits (e.g., flip flops), where each one has a single forced state. Some of the sequential logic circuits have a forced state corresponding to a binary one value, and others of the sequential logic circuits have a forced state corresponding to a binary zero value.

At block 540, each individual logic circuit of the sequential logic assumes its respective forced state in response to receiving the reset signal. As a result, the sequential logic outputs a multi-bit binary value to a unit of combinational logic. As explained with regard to FIG. 4, some examples include changing states of the flip flops themselves by use of the reset signal. The multi-bit binary value is a combination of ones and zeros, and the value is output to the combinational logic.

The multi-bit binary value causes the processing stage, including the sequential logic and the combinational logic, to assume a desired (e.g., low) leakage state. In one example, the desired leakage state includes a state, selected out of multiple possible states, corresponding to a lowest leakage value achievable by forcing a reset of the sequential logic. In another example, the desired leakage state includes a state that has a lower leakage characteristic than other possible states, but is not necessarily the lowest leakage state possible.

At block 550, the processing stage resumes normal operation after the clock is un-halted and the reset line 106 is de-asserted. Thus, the clock gating operation ends, and data bits are clocked into the processing stage as in block 510. In the present example, the processing stage does not require state preservation and, thus, the forced value does not adversely affect processing of the subsequent data bits.

Figure 5:
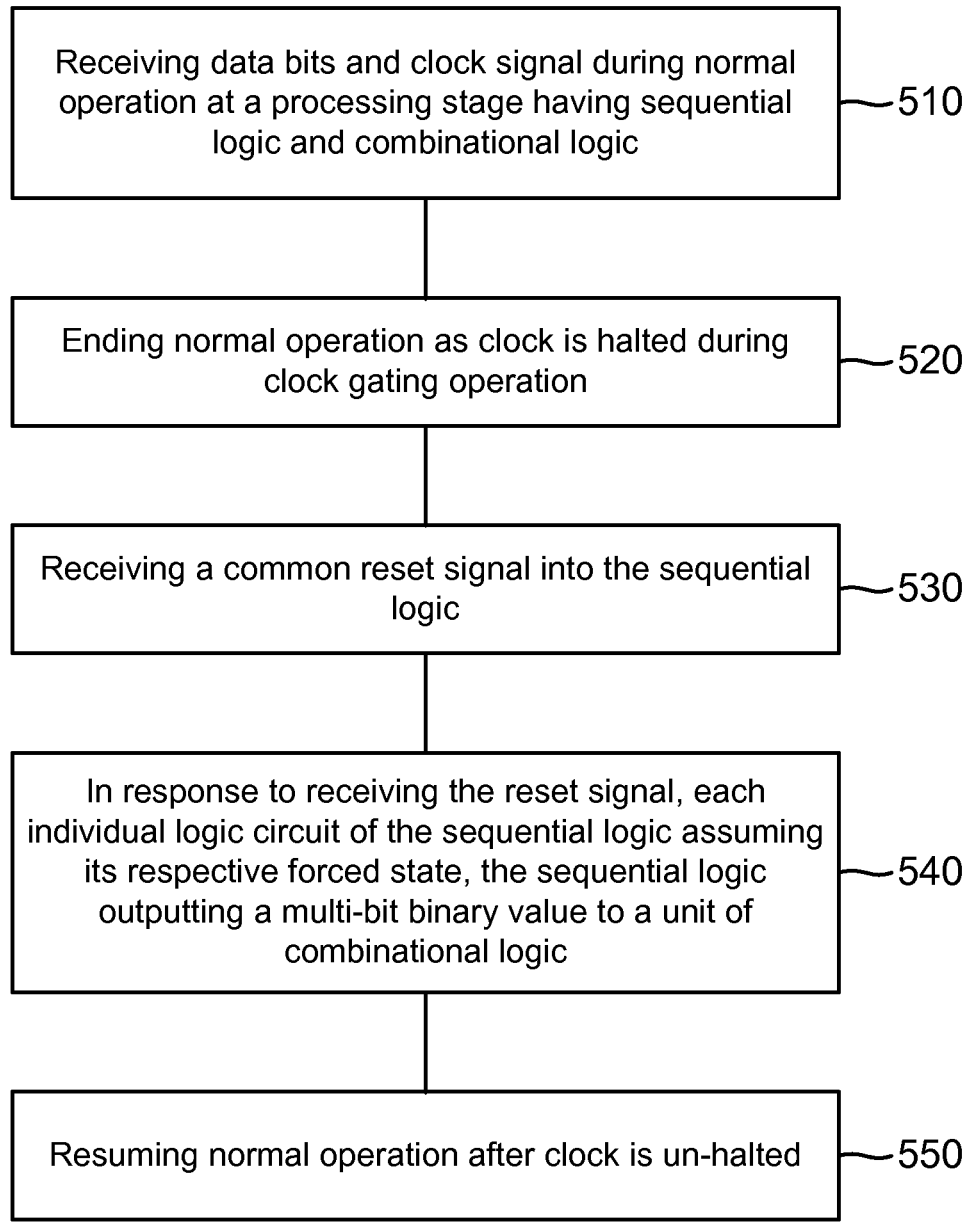
FIG. 5 illustrates a flowchart of an example method of use for the system of FIGS. 1 and 4 to achieve a desired leakage state in accordance with an embodiment of the disclosure.

The scope of embodiments is not limited to the specific method shown in FIG. 5. Other embodiments may add, omit, rearrange, or modify one or more actions. For instance, in many real-world applications, the actions of blocks 520-540 are not performed in series, but rather are performed concurrently as the clock is gated and the reset signal is asserted. Also, the actions of blocks 510-550 are performed repeatedly as the processing stage has periods of activity (corresponding to normal operation) and other periods of being idle (corresponding to clock gating operations) during a power-on period that may last minutes or hours.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit comprising:
   combinational logic; and
   a plurality of sequential logic units configured to output values to the combinational logic, thereby affecting a state of the combinational logic;
   wherein a first subset of the sequential logic units is configured to reset to a single, first binary state, and wherein a second subset of the sequential logic units is configured to reset to a single, second binary state, the first and second binary states being different; and
   further wherein the plurality of sequential logic units are configured to collectively output a multi-bit binary value to the combinational logic when the sequential logic units are forced to reset, wherein the combinational logic is included in a pipeline stage of a processor.

2. The circuit of claim 1, wherein the combinational logic comprises a portion of a floating point logic unit of a processor.

3. The circuit of claim 1, wherein each sequential logic unit comprises:
   a master latch and a slave latch configured to force a reset of a given sequential logic unit to affect a value stored by either or both of the master latch and the slave latch.

4. The circuit of claim 1, wherein the first subset of sequential logic units comprises SET flops configured to reset to a binary 1 value, and wherein the second subset of sequential logic units comprises RESET flops configured to reset to a binary 0 value, further wherein the binary 1 value comprises the first binary state and the binary 0 value comprises the second binary state.

5. The circuit of claim 1 further comprising:
   circuitry configured to force the plurality of sequential logic units to reset using a single reset signal.

6. The circuit of claim 5, wherein the circuitry configured to force the plurality of sequential logic units to reset comprises a clock gating controller configured to assert the reset signal during a clock gating operation.

7. The circuit of claim 1, wherein the multi-bit binary value corresponds to a collective low leakage state of the sequential logic units and combinational logic.

8. The circuit of claim 7, wherein the low leakage state of the sequential logic units and combinational logic comprises a state, selected out of multiple possible states, corresponding to a lowest leakage value achievable by forcing a reset of the sequential logic units.

9. The circuit of claim 1, wherein the sequential logic units comprise D flip flops.

10. A method comprising:
    receiving a reset signal into a plurality of flip flops, the plurality of flip flops including:
    a first subset of the flip flops each having a single forced state corresponding to a binary zero; and
    a second subset of the flip flops each having a single forced state corresponding to a binary one; and
    in response to receiving the reset signal, each of the flip flops of the plurality of flip flops assuming its respective forced state, the plurality of flip flops outputting a multi-bit binary value to a group of combinational logic gates;
    wherein the multi-bit binary value causes circuitry, comprising the plurality of flip flops and the combinational logic gates, to assume a collective state of the circuitry, wherein the reset signal is received during a clock gating operation.

11. The method of claim 10, wherein the clock gating operation comprises halting a clock signal provided to the flip flops.

12. The method of claim 10, further comprising:
    after the clock gating operation ends, receiving the clock signal and data at the flip flops.

13. The method of claim 10, wherein the collective state is a low leakage state that comprises a state, selected out of multiple possible states, corresponding to a lowest leakage value achievable by forcing a reset of the flip flops.

14. The method of claim 10, wherein the flip flops comprise D flip flops.

15. The method of claim 10, wherein the combinational logic gates are included in a pipeline stage of a processor.

16. The method of claim 10, wherein the reset signal is received at startup of a processor.

17. A stage in a processing device, the stage comprising:
    a plurality of flip flops, each of the flip flops having a single forced state and a reset input, wherein a first subset of the flip flops is configured to reset to a one value, and wherein a second subset of the flip flops is configured to reset to a zero value; and
    combinational logic including a plurality of logic gates, the combinational logic configured to receive a multi-bit binary value output from the plurality of flip flops;
    wherein a signal at the reset inputs of the plurality of flip flops is configured to cause the flip flops to assume their forced states and to output a value of ones and zeros to the combinational logic, the value of ones and zeros corresponding to a collective state of the stage, wherein the stage comprises a stage in a microprocessor with a pipeline architecture.

18. The stage of claim 17, wherein the collective state is a low leakage state that comprises a state, selected out of multiple possible states, corresponding to a lowest leakage value achievable by forcing a reset of the flip flops.

19. The stage of claim 17, further comprising:
    a clock gating circuit configured to suspend a clock input to the flip flops.

20. The stage of claim 19, wherein the clock gating circuit is in communication with the reset inputs of the flip flops and configured to assert the signal at the reset inputs when suspending the clock input.

21. The stage of claim 17, wherein the flip flops comprise D flip flops.

22. The stage of claim 17, wherein each of the flip flops comprises a master latch and a slave latch, further in which the signal at the reset input of a given one of the flip flops is configured to affect a value stored by a master latch or a slave latch at that flip flop.

23. The stage of claim 17, wherein the stage is included in a floating point unit of the processing device.

24. The stage of claim 17, wherein the signal at the reset inputs is a common reset signal for the plurality of flip flops.

25. A logical unit of a processor circuit, the logical unit comprising:
- a heterogeneous mix of SET and RESET flip flops, each of the flip flops outputting a value;
- combinational logic receiving the values output by each of the flip flops, the combinational logic including cascaded logic gates; and
- means for asserting a reset signal to the flip flops, the reset signal configured to cause the flip flops to assume respective forced states and to output a multi-bit number to the combinational logic, the multi-bit number corresponding to a low leakage state of the logical unit, wherein the means for asserting the reset signal comprises clock gating circuitry configured to assert the reset signal when suspending a clock to the flip flops.

26. The logical unit of claim 25, wherein:
the SET flip flops are configured to assume a forced state of one when the reset signal is asserted; and
the RESET flip flops are configured to assume a forced state of zero when the reset signal is asserted.

* * * * *